(12) United States Patent
Hiroshima et al.

(10) Patent No.: US 10,367,521 B2
(45) Date of Patent: Jul. 30, 2019

(54) SIGNAL PROCESSOR AND CONTROL APPARATUS

(71) Applicant: RENESAS ELECTRONICS CORPORATION, Tokyo (JP)

(72) Inventors: Akane Hiroshima, Tokyo (JP); Yuji Shimizu, Tokyo (JP); Yutaka Ono, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/441,868

(22) Filed: Feb. 24, 2017

(65) Prior Publication Data

US 2017/0250701 A1 Aug. 31, 2017

(30) Foreign Application Priority Data

Feb. 26, 2016 (JP) ................................. 2016-035828

(51) Int. Cl.
| | |
|---|---|
| H02K 11/225 | (2016.01) |
| H03M 1/48 | (2006.01) |
| G01D 5/20 | (2006.01) |
| G01B 7/30 | (2006.01) |
| H03M 1/20 | (2006.01) |
| H02P 6/16 | (2016.01) |

(52) U.S. Cl.
CPC .............. H03M 1/485 (2013.01); G01B 7/30 (2013.01); G01D 5/2053 (2013.01); H02K 11/225 (2016.01); H02P 6/16 (2013.01); H02P 6/201 (2013.01); H03M 1/201 (2013.01)

(58) Field of Classification Search
CPC .......................... H02M 1/485; H02K 11/225
USPC ................................................... 318/400.39
See application file for complete search history.

(56) References Cited

U.S. PATENT DOCUMENTS

| | | | | |
|---|---|---|---|---|
| 3,532,995 | A * | 10/1970 | Barker | G01S 13/34 327/4 |
| 3,676,659 | A * | 7/1972 | Asmussen | G08C 19/48 318/563 |
| 4,843,291 | A * | 6/1989 | Predina | G05B 19/33 318/603 |
| 5,637,998 | A | 6/1997 | Kushihara | |
| 6,389,373 | B1 * | 5/2002 | Ohya | H03M 1/485 347/116 |
| 6,522,097 | B2 | 2/2003 | Fujimoto et al. | |
| 8,212,515 | B2 * | 7/2012 | Hasegawa | G01D 5/2451 318/601 |
| 9,641,367 | B2 * | 5/2017 | Shimizu | H04L 27/20 |
| 9,832,054 | B2 * | 11/2017 | Shimizu | H04L 7/0008 |

(Continued)

FOREIGN PATENT DOCUMENTS

| | | |
|---|---|---|
| JP | 8-35856 A | 2/1996 |
| JP | 8-287173 A | 11/1996 |
| JP | 2004-347612 A | 12/2004 |

*Primary Examiner* — Kawing Chan
(74) *Attorney, Agent, or Firm* — McDermott Will & Emery LLP

(57) ABSTRACT

The present invention provides a signal processor that improves a resolution of a phase detection without increasing a clock frequency of a controller or decreasing a frequency of an excitation signal. A signal processor 10 includes a comparator 11 that compares a signal obtained by phase modulating a carrier frequency at a rotor rotation angle of a resolver with a dither signal.

10 Claims, 14 Drawing Sheets

(56) References Cited

U.S. PATENT DOCUMENTS

| | | | |
|---|---|---|---|
| 2007/0186691 A1* | 8/2007 | Morishita | G01P 3/46 |
| | | | 73/862.326 |
| 2011/0101899 A1* | 5/2011 | Manabe | G01P 3/48 |
| | | | 318/400.04 |
| 2011/0266987 A1* | 11/2011 | Markunas | H02P 21/18 |
| | | | 318/400.24 |
| 2015/0158396 A1* | 6/2015 | Walters | H02P 6/16 |
| | | | 701/22 |
| 2017/0041168 A1* | 2/2017 | Shimizu | H04L 27/20 |
| 2017/0222850 A1* | 8/2017 | Shimizu | H04L 7/0012 |

* cited by examiner

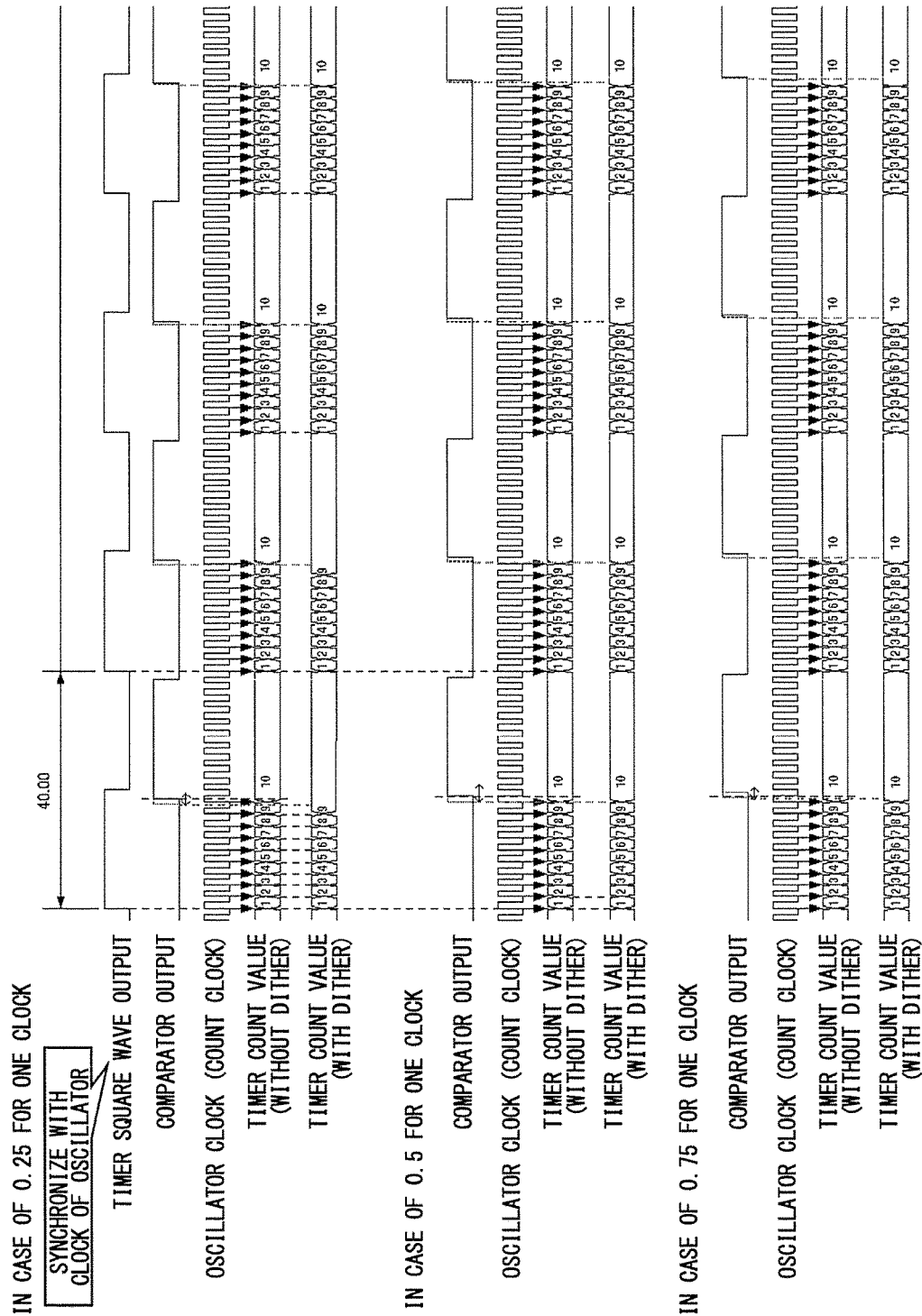

SIGNAL PROCESSOR AND CONTROL APPARATUS

CROSS-REFERENCE TO RELATED APPLICATIONS

This application is based upon and claims the benefit of priority from Japanese patent application No. 2016-035828, filed on Feb. 26, 2016, the disclosure of which is incorporated herein in its entirety by reference.

BACKGROUND

The present invention relates to a signal processor and a control apparatus and relates to, for example, a signal processor and a control apparatus used to control a motor.

A resolver that detects a rotation angle from variations in a magnetic field due to a rotation of a rotor is known as a rotation angle sensor.

Japanese Unexamined Patent Application Publication No. 8-287173 and Japanese Unexamined Patent Application Publication No. 8-35856 disclose a method of shifting a phase of one of two-phase resolver signals obtained by single-phase excitation by 90° by a signal processor, synthesizing the resulting signal with the other one of the two-phase resolver signals, and detecting an angle of a resolver from the synthesized signal. Further, Japanese Unexamined Patent Application Publication No. 2004-347612 discloses an apparatus that detects whether there is an abnormality in a detected angle of a resolver.

According to the aforementioned methods, when a rotor of the resolver is rotated, the phase shift amount by a phase shifter is deviated from 90°, which causes a larger error in the angle to be detected.

Another technique for shifting the phase of the resolver signal includes a resolver digital converter (RD converter). The RD converter detects a signal synthesized from resolver signals with two-phase outputs and a carrier signal that excites a resolver through synchronous detection and feeds back an amount of shift of the phase from the detection signal to perform tracking.

In the apparatuses that detect the angle of the resolver according to related art, however, a signal processor that improves the resolution of the phase detection without increasing the clock frequency of the controller or decreasing the frequency of the excitation signal is not achieved.

The other problems of the related art and the novel characteristics of the present invention will be made apparent from the descriptions of the specification and the accompanying drawings.

SUMMARY

According to one embodiment, a signal processor includes a comparator that compares a signal obtained by phase modulating a carrier frequency at a rotor rotation angle of a resolver with a dither signal.

It is possible to provide a signal processor that improves the resolution of the phase detection without increasing the clock frequency of the controller or decreasing the frequency of the excitation signal.

BRIEF DESCRIPTION OF THE DRAWINGS

The above and other aspects, advantages and features will be more apparent from the following description of certain embodiments taken in conjunction with the accompanying drawings, in which:

FIG. 7A is a diagram showing an example of the comparison between the phase modulation signal and the dither signal;

DETAILED DESCRIPTION

Figure 1:
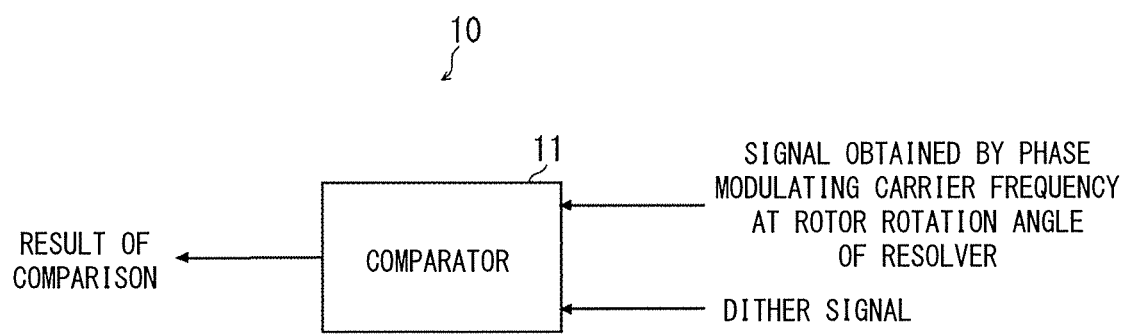
FIG. 1 is a block diagram showing a configuration of a signal processor according to an outline of embodiments.

For the clarification of the description, the following description and the drawings may be omitted or simplified as appropriate. Further, each element shown in the drawings as functional blocks that perform various processing can be formed of a CPU, a memory, and other circuits in hardware and may be implemented by programs loaded in the memory in software. Those skilled in the art will therefore understand that these functional blocks may be implemented in various ways by only hardware, only software, or the combination thereof without any limitation. Throughout the drawings, the same components are denoted by the same reference symbols and overlapping descriptions will be omitted as appropriate.

Outline of Embodiments

FIG. 1 is a block diagram showing a configuration of a signal processor according to an outline of embodiments. In FIG. 1, a signal processor 10 includes a comparator 11.

The comparator 11 compares a signal obtained by phase modulating a carrier frequency at a rotor rotation angle of a resolver with a dither signal. The comparator 11 then outputs a signal indicating the result of the comparison.

As stated above, the signal processor according to the outline of the embodiments compares the signal obtained by phase modulating the carrier frequency at the rotor rotation angle of the resolver with the dither signal, whereby it is possible to improve the resolution of the phase detection without increasing the clock frequency of the controller or decreasing the frequency of the excitation signal.

First Embodiment

In a first embodiment, a detailed configuration of the signal processor 10 described in the outline of the embodiments and a control apparatus of a motor that uses the signal processor 10 will be described.

Figure 2:
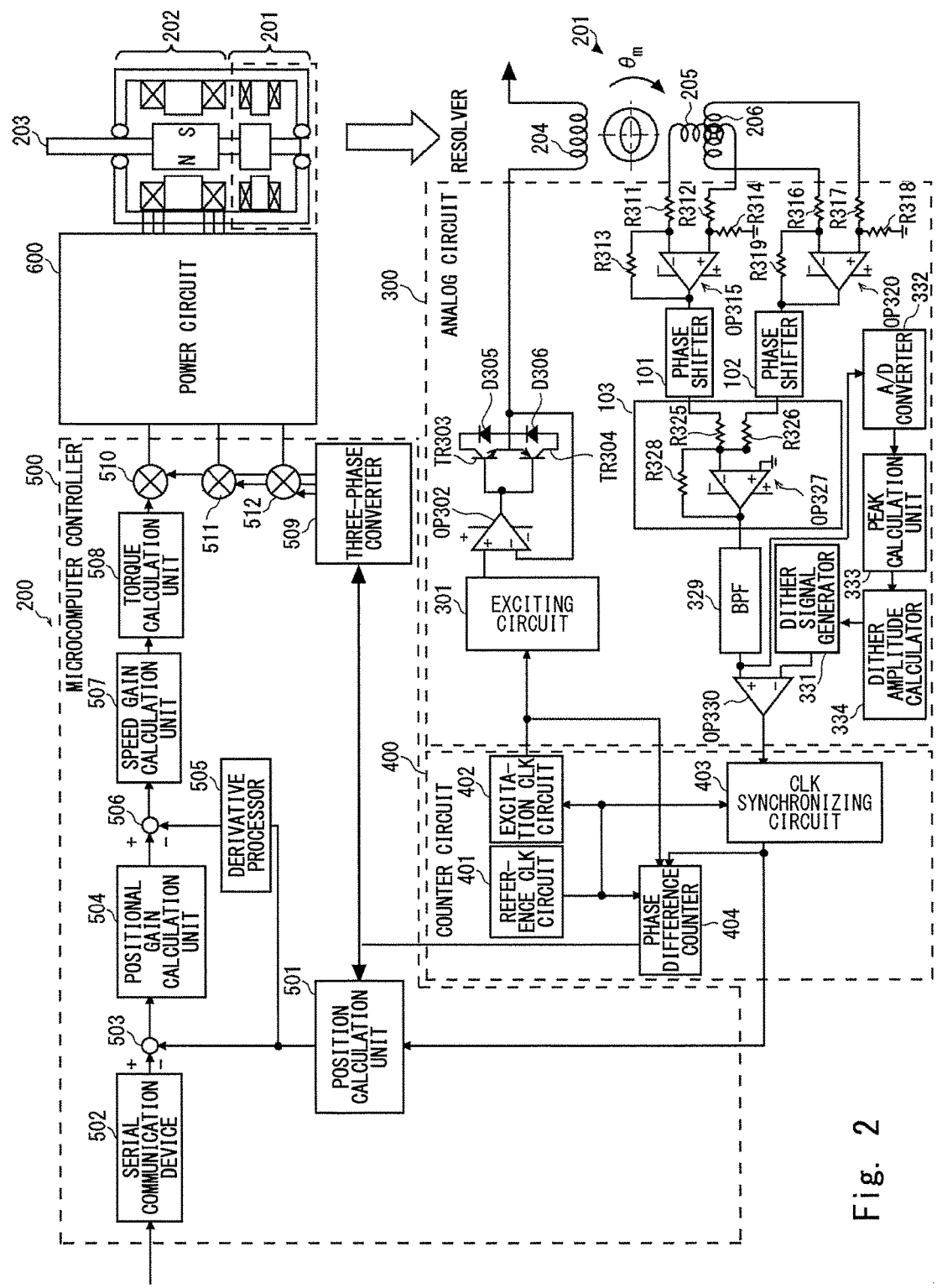
FIG. 2 is a block diagram showing configurations of a signal processor and a control apparatus according to a first embodiment.

First, functions of the respective components of the signal processor and the control apparatus according to the first embodiment will be described. FIG. 2 is a block diagram showing a configuration of the control apparatus according to the first embodiment. The configuration of an OP amplifier 330 shown in FIG. 2 described later corresponds to the configuration of the comparator 11 shown in FIG. 1.

In FIG. 2, a control apparatus 200 includes an analog circuit 300, a counter circuit 400, a microcomputer controller 500, and a power circuit 600. The control apparatus 200 controls a rotation of a motor 202 based on a signal from a resolver 201. The resolver 201 and the motor 202 each have a rotor part fixed to a rotation axis 203 and both the resolver 201 and the motor 202 rotate.

The resolver 201 further includes an exciting coil 204, a detection coil 205, and a detection coil 206. The exciting coil 204 is a coil that generates a magnetic field by an electric signal that has been input. The detection coils 205 and 206 are coils that detect variations in the magnetic field and output the detected variations as electric signals.

In the resolver 201, the exciting coil 204, the detection coil 205, and the detection coil 206 are arranged in a stator part and the variations in the magnetic field are detected by a rotation of the rotor part. It is sufficient that the resolver 201 be able to detect the variations in the magnetic field due to the rotation of the rotor as an electric signal having at least two or more phases. The resolver 201 may include, for example, the exciting coil 204 arranged in the rotor part and the detection coil 205 and the detection coil 206 arranged in the stator part, and detect the variations in the magnetic field due to the rotation of the rotor part.

The detection coil 205 and the detection coil 206 are arranged to form a predetermined angle so that the detection coil 205 and the detection coil 206 detect the variations in the magnetic field as signals whose phases are different from each other. The detection coil 205 and the detection coil 206 are arranged, for example, at an angle of 90°, whereby a sinusoidal wave is detected in the detection coil 205 and a cosine wave is detected in the detection coil 206.

Next, a configuration of the analog circuit 300 will be described. The analog circuit 300 includes an exciting circuit 301, a phase shifter 101, a phase shifter 102, a bandpass filter 329, OP amplifiers OP302, OP315, OP320, OP327, and OP330, a dither signal generator 331, an A/D converter 332, a peak calculation unit 333, a dither amplitude calculator 334, transistors TR303 and TR304, diodes D305 and D306, and resistors R311, R312, R313, R314, R316, R317, R318, R319, R325, R326, and R328.

The exciting circuit 301 generates a sinusoidal carrier signal at a frequency fc at which a reference clock signal is divided and outputs the carrier signal to the OP amplifier OP302.

The OP amplifier OP302, the transistors TR303 and TR304 connected in push-pull connection, and the diodes D305 and D306 amplify the carrier signal and output the carrier signal after the amplification to the exciting coil 204 of the resolver 201.

The OP amplifier OP315 and the resistors R311, R312, R313, and R314 form a differential amplifier, amplify the signal detected by the detection coil 205, and output the amplified signal to the phase shifter 101. In a similar way, the OP amplifier OP320 and the resistors R316, R317, R318, and R319 form a differential amplifier, amplify the signal detected by the detection coil 206, and output the amplified signal to the phase shifter 102.

The first phase shifter 101 shifts the phase of a first phase signal of the resolver at a pole of a frequency f1, which is lower than the carrier frequency fc and outputs the first phase signal whose phase has been shifted to a synthesizer 103. The first phase shifter 101 is preferably formed of an OP amplifier.

The second phase shifter 102 shifts the phase of a second phase signal of the resolver at a pole of a frequency f2, which is higher than the carrier frequency fc and outputs the second phase signal whose phase has been shifted to the synthesizer 103. The second phase shifter 102 is preferably formed of an OP amplifier.

For example, the carrier frequency fc, the frequency f1 at the pole of the phase shifter 101, and the frequency f2 at the pole of the phase shifter 102 satisfy $f1=fc/n$ and $f2=fc\times n$ (n is an arbitrary positive real number), whereby the difference between the phase shift of the phase shifter 101 and the phase shift of the phase shifter 102 can be made about 90°.

The output of the phase shifter 101 and the output of the phase shifter 102 are connected to each other via the resistors R325 and R326, whereby a signal obtained by phase modulating the carrier frequency at the rotor rotation angle is obtained.

The OP amplifier OP327 and the resistor R328 form an inverting amplification circuit, amplify the signal obtained by phase modulating the carrier frequency at the rotor rotation angle, and output the resulting signal to the bandpass filter 329. These resistors R325, R326, and R328 and the OP amplifier OP327 form the synthesizer 103.

The bandpass filter 329 attenuates a range of a phase modulation signal other than a predetermined frequency range and outputs the resulting signal to the OP amplifier OP330 and the A/D converter 332. The predetermined frequency range is, for example, a range in which the carrier frequency may change depending on the rotation speed of the rotor.

The OP amplifier OP330 forms a comparator that compares the phase modulation signal output from the bandpass filter 329 with the dither signal output from the dither signal generator 331. This dither signal is a signal whose amplitude is periodically changed. Since the periodic change in the amplitude corresponds to the phase shift, the phase modulation signal is dithered in a phase direction by the OP amplifier OP330. The OP amplifier OP330 then outputs a signal indicating the result of the comparison (that is, the phase modulation signal dithered in the phase direction) to a CLK synchronizing circuit 403.

The dither signal generator 331 generates the dither signal and outputs the dither signal to the comparator 11. Specifically, the dither signal generator 331 generates a signal having a frequency lower than that of a reference clock signal generated by a reference CLK circuit 401 (described later). The signal generated by the dither signal generator 331 may be any one of a triangular wave, a sinusoidal wave, a sawtooth wave or the like as long as the amplitude of the wave is periodically changed. Further, the dither signal generator 331 generates the dither signal with a maximum amplitude value indicated by the dither amplitude calculator 334 that will be described later.

The A/D converter 332 converts the phase modulation signal output from the bandpass filter 329 from an analog signal into a digital signal and outputs the digitized phase modulation signal to the peak calculation unit 333.

The peak calculation unit 333 calculates the maximum amplitude value of the digitized phase modulation signal and outputs the maximum amplitude value of the phase modulation signal to the dither amplitude calculator 334.

The dither amplitude calculator 334 calculates the amplitude value of the dither signal based on the maximum amplitude value of the phase modulation signal and sends the amplitude value of the dither signal to the dither signal generator 331. When the maximum amplitude value of the phase modulation signal is denoted by Vm, the frequency is denoted by f, and the phase shift is denoted by $\Delta t$, for example, the amplitude value of the dither signal is obtained by $Vm \times \sin(2\pi f \times \Delta t)$.

Next, a configuration of the counter circuit 400 will be described. The counter circuit 400 includes the reference CLK circuit 401, an excitation CLK circuit 402, a phase difference counter 404, and the CLK synchronizing circuit 403.

The reference CLK circuit 401 generates a reference frequency signal and outputs the generated reference clock signal to the excitation CLK circuit 402, the phase difference counter 404, and the CLK synchronizing circuit 403.

The excitation CLK circuit 402 divides the frequency of the reference clock signal generated by the reference CLK circuit 401 and outputs the clock signal of the carrier frequency that has been obtained by frequency division to the exciting circuit 301 and the phase difference counter 404.

The CLK synchronizing circuit 403 detects the phase modulation signal that has been shaped and the carrier signal that has been shaped through synchronous detection and outputs a detection signal to the phase difference counter 404 and a position calculation unit 501.

The phase difference counter 404 counts the phase difference obtained by the synchronous detection at the reference frequency resolution and outputs the result of the count to the position calculation unit 501 and a three-phase converter 509.

Next, a configuration of the microcomputer controller 500 will be described. The microcomputer controller 500 includes the position calculation unit 501, a serial communication device 502, a subtractor 503, a positional gain calculation unit 504, a derivative processor 505, a subtractor 506, a speed gain calculation unit 507, a torque calculation unit 508, the three-phase converter 509, and multiplexers 510, 511, and 512.

The position calculation unit 501 calculates a positional detection value from the detection signal and the result of counting the phase difference and outputs the positional detection value to the subtractor 503 and the derivative processor 505.

The serial communication device 502 receives a position indication signal from outside and outputs a position command value to the subtractor 503. The subtractor 503 subtracts the position command value from the positional detection value and outputs the resulting positional deviation to the positional gain calculation unit 504.

The positional gain calculation unit 504 multiplies the positional deviation by a predetermined positional gain to calculate the target speed of the motor 202. The derivative processor 505 differentiates the detection signal indicating the rotation position to calculate the rotation speed of the motor 202. The subtractor 506 subtracts the speed detection value from the target speed and outputs the resulting speed deviation to the speed gain calculation unit 507.

The speed gain calculation unit 507 multiplies the speed deviation by the speed gain to calculate a torque command value. The torque calculation unit 508 calculates a command value of the current flowing into each phase of the motor 202 from the torque command value. The three-phase converter 509 generates a three-phase signal from the result of counting the phase difference and outputs the three-phase signal to each of the multiplexers 510, 511, and 512.

The multiplexers 510, 511, and 512 respectively multiply a current command value by the three-phase signal to generate a three-phase control signal and output the three-phase control signal to the power circuit 600. The power circuit 600 is an inverter that performs three-phase Pulse Width Modulation (PWM) control on the motor 202 based on the three-phase control signal.

According to the above configuration, the control apparatus of the motor that uses the signal processor 10 detects the rotor rotation angle of the resolver and controls the motor.

Next, signal processing will be described. First, the signal input to the signal processor 10, that is, the signal obtained by phase modulating the carrier frequency by the rotor rotation angle of the resolver, will be described. The carrier signal generated in the exciting circuit 301 is amplified by the OP amplifier OP302 and the transistors TR303 and TR304 and then the amplified signal is input to the exciting coil 204.

The magnetic field generated in the exciting coil 204 varies due to the rotation of the rotor part of the resolver 201. This magnetic variation is detected in the detection coils 205 and 206.

When the exciting coil 204 is excited by a carrier signal of a sinusoidal wave sin ω by a single-phase excitation and two-phase output signals detected in the detection coils 205 and 206 are amplified, for example, two-phase output signals X1 and X2 after the amplification are defined by the following expressions.

$$X1 = K \cdot \sin\theta m \times \sin\omega t$$

$$X2 = K \cdot \cos\theta m \times \sin\omega t$$

The symbol ω indicates an angular momentum of the carrier signal, t indicates time, θm indicates the rotation angle of the rotor of the resolver 201, and K is the gain of the OP amplifier OP315 and the OP amplifier 317.

When the phase shift in the phase shifter 101 is denoted by $\varphi 1$, the phase shift in the phase shifter 102 is denoted by $\varphi 2$, and an all-pass filter is used for each of the phase shifters 101 and 102, $\varphi 1 - \varphi 2 = -90°$ can be designed. By setting the frequency at the pole of the phase shifter 101 to 1.99 Hz and setting the frequency at the pole of the phase shifter 102 to 11.8 kHz with respect to the carrier frequency fc=4.88 kHz, $\varphi 1 - \varphi 2 = -90°$ can be established.

The signals after filtering in the phase shifters 101 and 102 can be defined by the following expressions.

$$X1 = K \cdot \sin\theta m \times \sin(\omega t - \varphi 1)$$

$$X2 = K \cdot \cos\theta m \times \sin(\omega t - \varphi 2)$$

From the relation $-\varphi 2 = -\varphi 1 - 90°$, the following relational expression can be derived.

$$X2 = K \cdot \cos\theta m \times \sin(\omega t - \varphi 1 - 90°) = -K \cdot \cos\theta m \times \cos(\omega t - \varphi 1)$$

The synthesizer 103 synthesizes the signals X1 and X2 after the phase shifting in the phase shifters 102 and 103. By adding X1 to X2, the following relational expression can be derived.

$$Y = X1 + X2$$
$$= K \cdot \sin\theta m \times \sin(\omega t - \varphi 1) - K \cdot \cos\theta m \times \cos(\omega t - \varphi 1)$$
$$= -K \cdot \cos(\omega t - \varphi 1 + \theta m)$$

Figure 3:
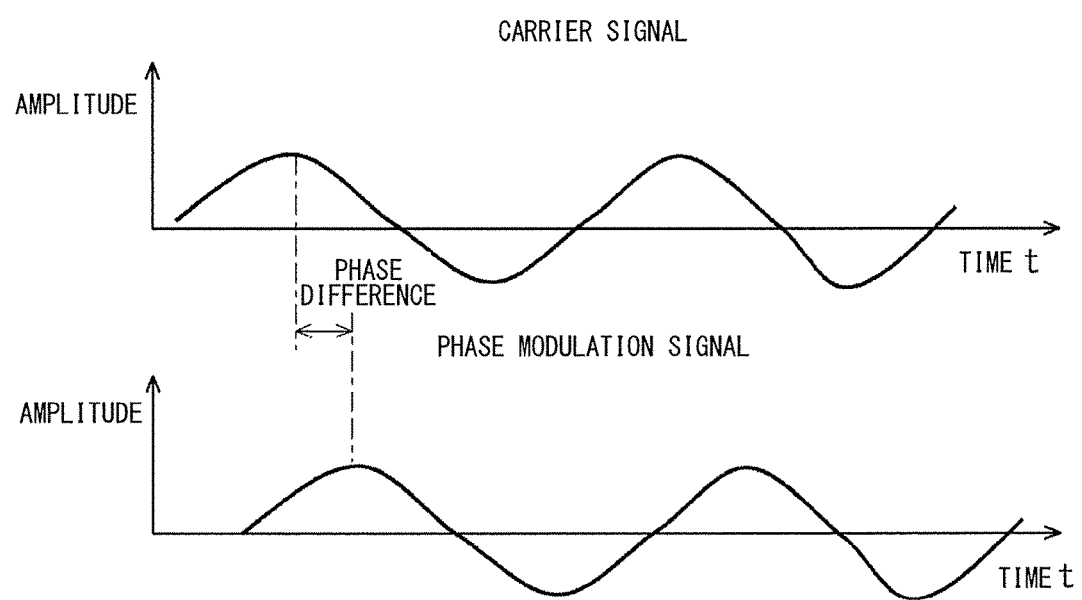
FIG. 3 show graphs showing examples of a carrier signal and a phase-modulated signal.

That is, a signal obtained by phase modulating the carrier frequency (angular frequency) ω at the rotor rotation angle θm is obtained. FIG. 3 show graphs showing examples of the carrier signal and the phase-modulated signal. In FIG. 3, the vertical axis shows the amplitude and the horizontal axis shows the time. As shown in FIG. 3, the carrier signal and the phase-modulated signal are signals having the same frequency but different phases. It is therefore possible to calculate the rotation angle of the rotor by the phase difference between the carrier signal and the phase-modulated signal.

In the first embodiment, the rotation angle of the rotor is calculated from the phase difference between signals that having been shaped into a rectangular wave. That is, the rotation angle of the rotor is calculated by the phase difference between the clock signal of the carrier frequency and the output signal of the comparator 11 (corresponding to the OP amplifier OP330 in FIG. 2).

Figure 4:
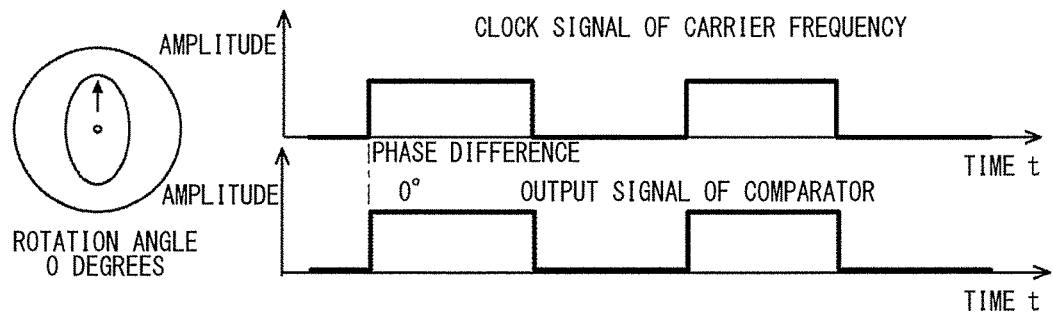
FIG. 4 is a diagram showing a relation among a rotation angle of a rotor, a clock signal of a carrier frequency, and an output signal of a comparator.
Figure 4:
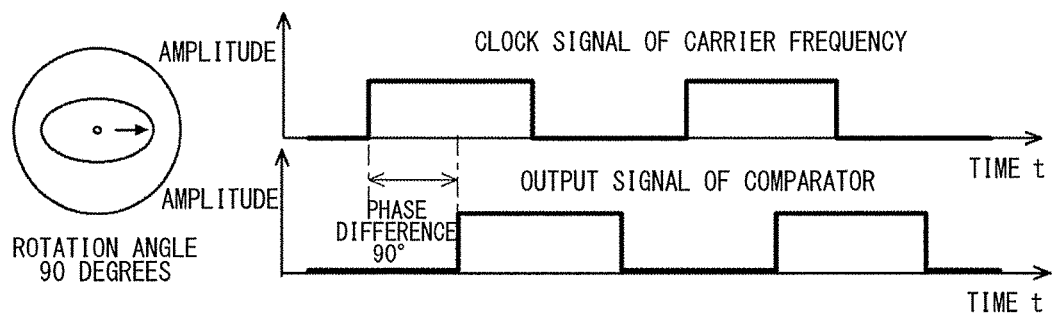
Figure 4:
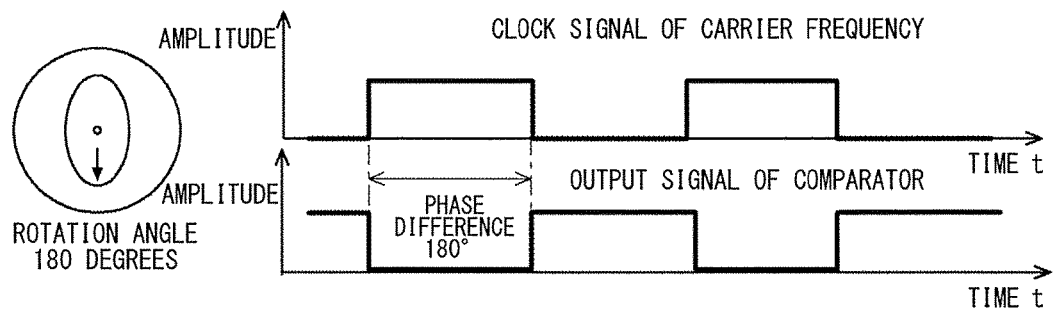
Figure 4:
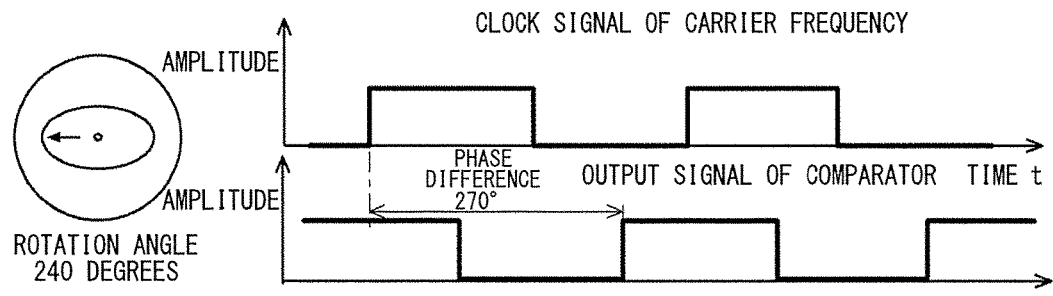

If the phase shift due to the dither signal is not considered for the output signal of the comparator, the phase difference between the clock signal of the carrier frequency and the output signal of the comparator corresponds to the rotation angle of the rotor. First, with reference to FIG. 4, the example in which the phase shift due to the dither signal is not considered will be described. FIG. 4 is a diagram showing a relation among the rotation angle of the rotor, the clock signal of the carrier frequency, and the output signal of the comparator. In FIG. 4, the vertical axis shows the amplitude and the horizontal axis shows the time.

The top view in FIG. 4 shows an example in which the rotation angle of the rotor is 0 degrees. In this example, the phase difference between the clock signal of the carrier frequency and the output signal of the comparator is 0 degrees. The second view from the top in FIG. 4 shows an example in which the rotation angle of the rotor is 90 degrees. In this example, the phase difference between the clock signal of the carrier frequency and the output signal of the comparator is 90 degrees. In a similar way, the third view from the top in FIG. 4 shows an example in which the rotation angle of the rotor is 180 degrees. In this example, the phase difference between the clock signal of the carrier frequency and the output signal of the comparator is 180 degrees. Further, the bottom view of FIG. 4 shows an example in which the rotation angle of the rotor is 270 degrees. In this example, the phase difference between the clock signal of the carrier frequency and the output signal of the comparator is 270 degrees.

As described above, the phase difference between the clock signal of the carrier frequency and the output signal of the comparator corresponds to the rotation angle of the rotor.

Figure 5:
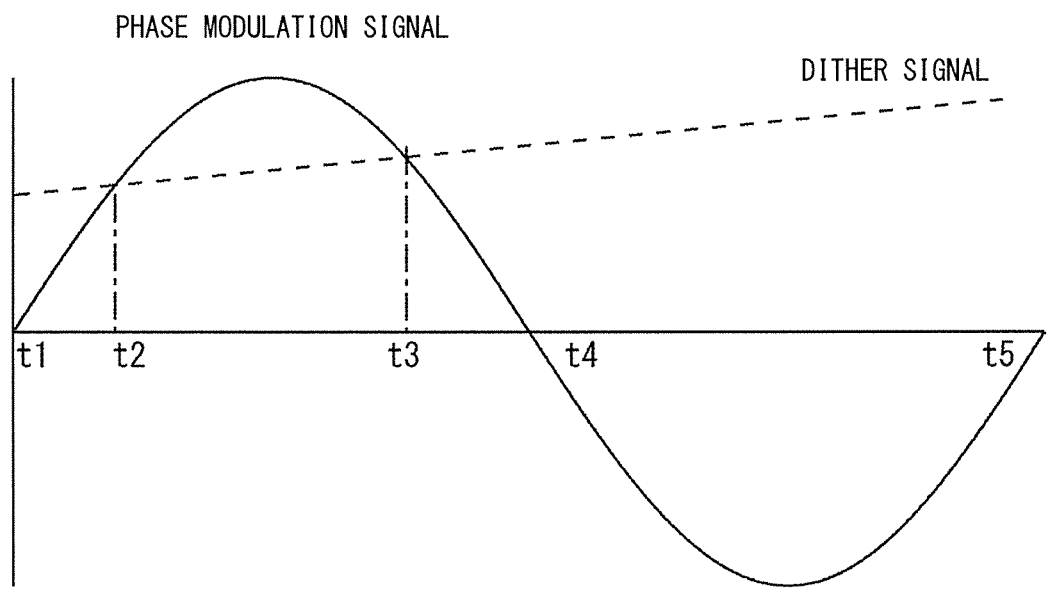
FIG. 5 is a diagram showing an example of a comparison between a phase modulation signal and a dither signal.

When the phase shift due to the dither signal is generated in the output signal of the comparator, by comparing the amplitude of the phase modulation signal with the amplitude of the dither signal that is periodically changed, the phase shift in accordance with the change in the amplitude of the dither signal is reflected in the output signal of the comparator. FIG. 5 is a diagram showing an example of the comparison between the phase modulation signal and the dither signal. In FIG. 5, the vertical axis shows the amplitude and the horizontal axis shows the time.

When the phase shift due to the dither signal is not considered for the output signal of the comparator, the phase modulation signal is compared with the ground potential 0 V. Therefore, when the amplitude of the phase modulation signal is positive (that is, from t1 to t4 in FIG. 5), the output signal of the comparator becomes positive and when the amplitude of the phase modulation signal is negative (that is, from t4 to t5 in FIG. 5), the output signal of the comparator becomes negative.

On the other hand, as shown in FIG. 5, in a case of comparing the amplitude of the phase modulation signal with the amplitude of the dither signal that is periodically changed, from t1 to t2, the amplitude of the phase modulation signal is smaller than the amplitude of the dither signal, which means the output signal of the comparator becomes negative. Further, from t2 to t3, the amplitude of the phase modulation signal is larger than the amplitude of the dither signal, which means the output signal of the comparator becomes positive. From t3 to t5, the amplitude of the phase modulation signal is smaller than the amplitude of the dither signal, which means the output signal of the comparator becomes negative.

Figure 6:
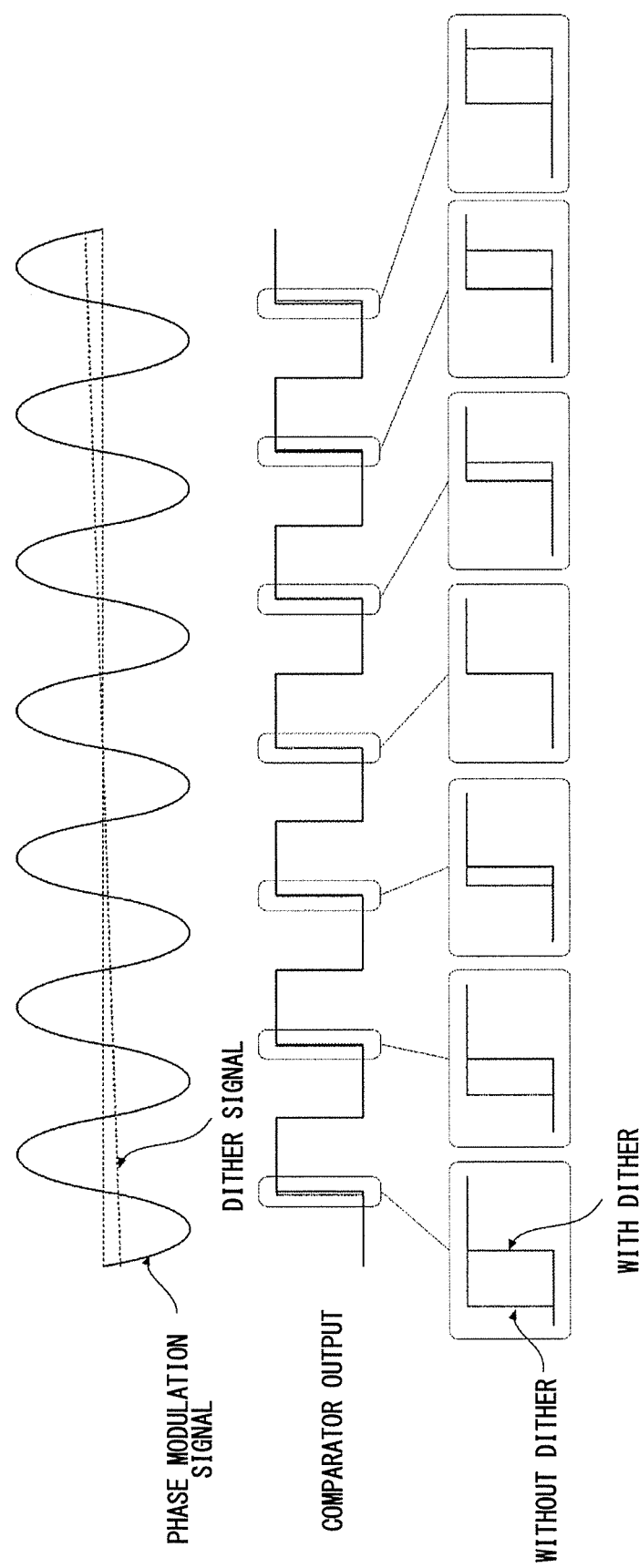
FIG. 6 is a diagram showing an example of the comparison between the phase modulation signal and the dither signal.

That is, due to the dither signal, the phase of the output signal of the comparator is deviated by the amount corresponding to time from t1 to t2. Since the amplitude of the dither signal is periodically changed, the output signal of the comparator has a different phase shift for each cycle of the carrier signal. With reference to FIG. 6, the different phase shift for each cycle will be described. FIG. 6 is a diagram showing an example of the comparison between the phase modulation signal and the dither signal. In FIG. 6, the vertical axis shows the amplitude and the horizontal axis shows the time. In FIG. 6, the dither signal is a sawtooth wave and the amplitude value increases with time for one cycle. As shown in FIG. 6, since the amplitude value of the dither signal varies for each cycle, the phase shift of the output signal of the comparator varies in accordance with the change in the amplitude value for each cycle. By averaging the count values of the output signal of the comparator for a plurality of cycles, the resolution is improved by the dither signal.

Figure 7B:
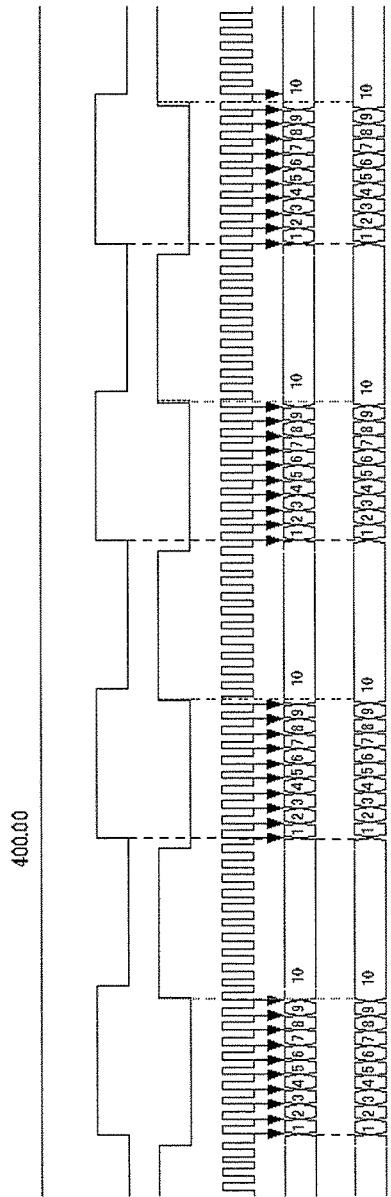
FIG. 7B is a diagram showing an example of the comparison between the phase modulation signal and the dither signal.
Figure 7B:
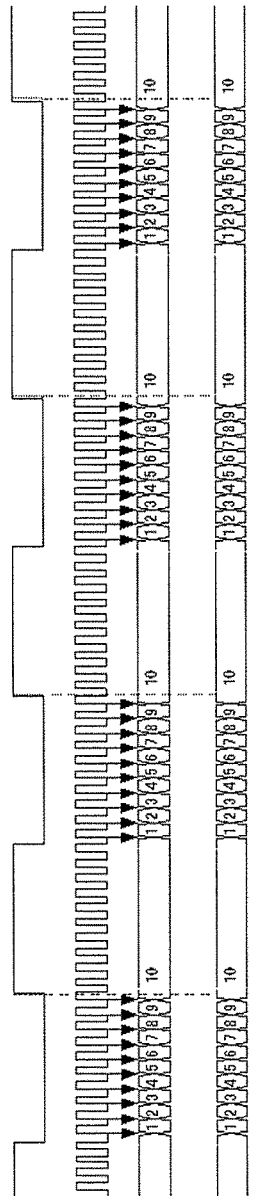
Figure 7B:
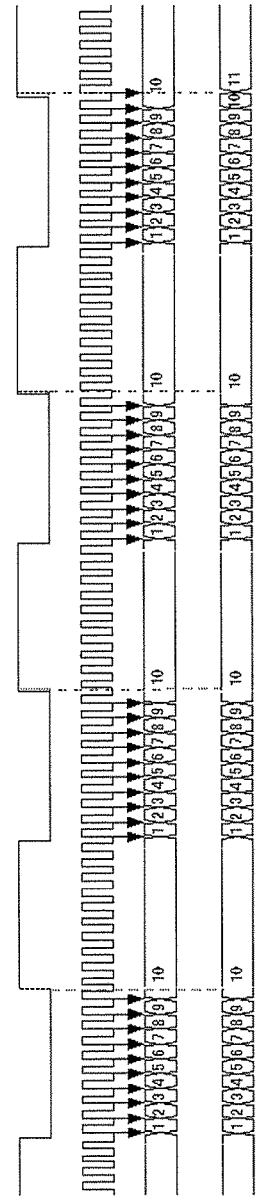
Figure 7C:
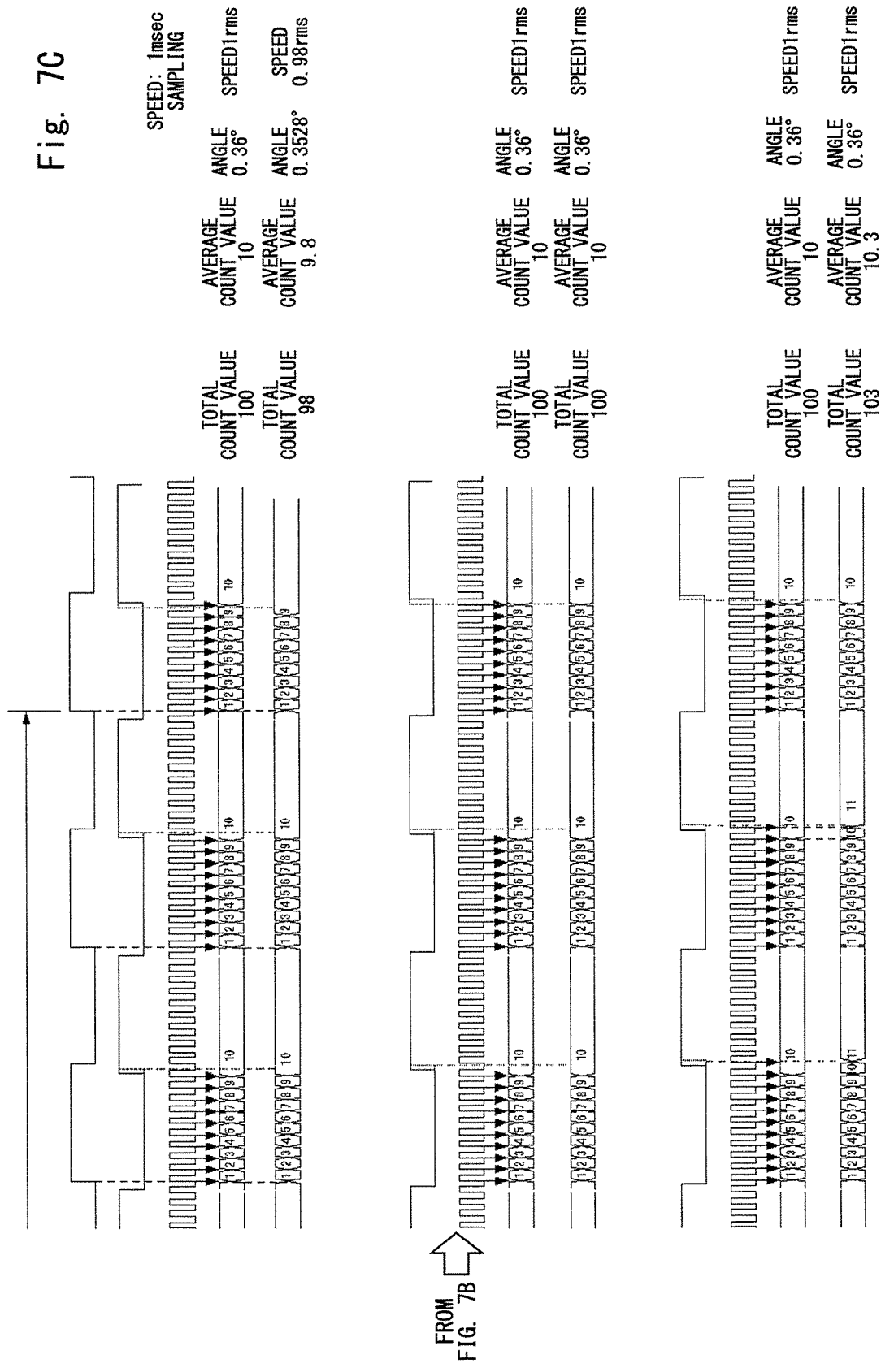
FIG. 7C is a diagram showing an example of the comparison between the phase modulation signal and the dither signal.

FIGS. 7A to 7C are diagrams showing examples of the comparison between the phase modulation signal and the dither signal. In FIGS. 7A to 7C, the vertical axis shows the amplitude and the horizontal axis shows the time. In FIGS. 7A to 7C, the clock signal of the carrier frequency, the output signal of the comparator, the reference clock signal, the count value of the phase difference counter 404 (without dither), and the count value of the phase difference counter 404 (with dither) are shown from top to bottom.

In FIGS. 7A to 7C, the frequency of the reference clock signal is set to 50 MHz. One count is equal to 0.02 μsec and the rotation angle per count becomes 0.02 μsec/200 μsec× 360°=0.036°. The clock signal of the carrier frequency and the output signal of the comparator are counted in units of one cycle of the reference clock signal in the phase difference counter 404.

When the phase shift due to the dither signal is not included in the output signal of the comparator, as shown in the fourth view from the top, the count values in the respective cycles are 10, 10, 10, 10, 10, 10, 10, 10, and 10, and the total count value for ten cycles becomes 100.

Accordingly, the average count value for one cycle becomes 10 and the measured rotation angle of the rotor is 0.36°.

On the other hand, when the phase shift due to the dither signal is included in the output signal of the comparator, as shown in the fifth view from the top, the count values in the respective cycles are 9, 9, 9, 10, 10, 10, 10, 10, 10, and 10, and the total count value for the ten cycles becomes 97. Therefore, the average count value for one cycle becomes 9.7 and the measured rotation angle of the rotor is 0.3492°.

As described above, due to the dither signal whose amplitude is changed, the output signal of the comparator has a different phase shift for each cycle. By averaging the values obtained by counting the output signal of the comparator in units of the reference clock signal, the resolution of the phase detection can be improved without increasing the clock frequency of the controller or decreasing the frequency of the excitation signal.

The results which show the improved resolution are shown in the following Table 1 and FIG. 8.

TABLE 1

| Phase Difference due to Rotation of Rotor (μsec) | Phase Difference obtained by Measurement | | | |
|---|---|---|---|---|
| | Without Dither | | With Dither | |
| | Phase Difference (μsec) | Number of Bits (LSB) | Phase Difference (μsec) | Number of Bits (LSB) |
| 0.154 | 0.140 | 0 | 0.144 | 0 |
| 0.158 | 0.140 | 0 | 0.148 | 0.2 |
| 0.162 | 0.160 | 1 | 0.152 | 0.4 |
| 0.166 | 0.160 | 1 | 0.158 | 0.7 |
| 0.17 | 0.160 | 1 | 0.160 | 0.8 |
| 0.174 | 0.160 | 1 | 0.164 | 1 |

Figure 8:
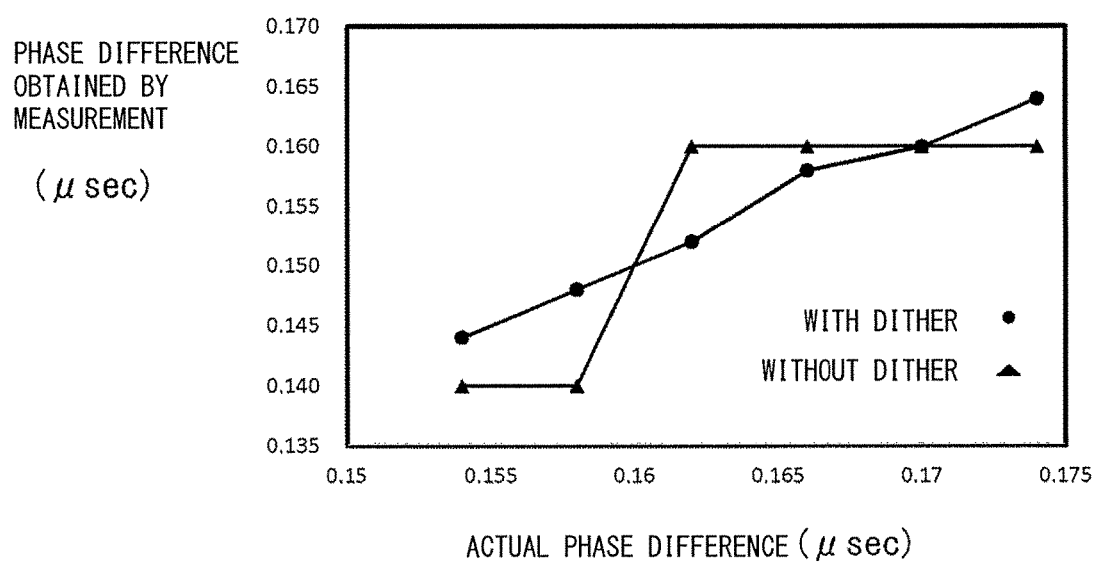
FIG. 8 is a graph showing a relation between a phase difference due to a rotation of the rotor and a phase difference obtained by a measurement.

FIG. 8 is a graph showing a relation between the phase difference due to the rotation of the rotor and the phase difference obtained by the measurement. In FIG. 8, the vertical axis shows the phase difference obtained by the measurement and the horizontal axis shows the phase difference due to the rotation of the rotor. FIG. 8 shows the results of Table 1 in the form of a graph.

As shown in FIG. 8, in the output of the comparator without dither, the phase difference obtained by the measurement is discretely changed between 0.140 μsec and 0.160 μsec. That is, the resolution of the phase difference is 0.02 μsec.

On the other hand, in the output of the comparator with dither, the phase difference obtained by the measurement is 0.144 μsec, 0.148 μsec, 0.152 μsec, 0.158 μsec, 0.160 μsec, and 0.164 μsec. In the output of the comparator with dither, the resolution of the phase difference is smaller than 0.02 μsec (that is, the resolution is improved).

As described above, in the signal processor according to the first embodiment, by comparing the signal obtained by phase modulating the carrier frequency at the rotor rotation angle of the resolver with the dither signal whose amplitude is periodically changed in the comparator, the phase shift due to the dither signal is generated in the output signal of the comparator, and the phase-modulated signal is dithered for the phase, whereby the resolution of the phase detection can be improved without increasing the clock frequency of the controller or decreasing the frequency of the excitation signal.

Figure 9:
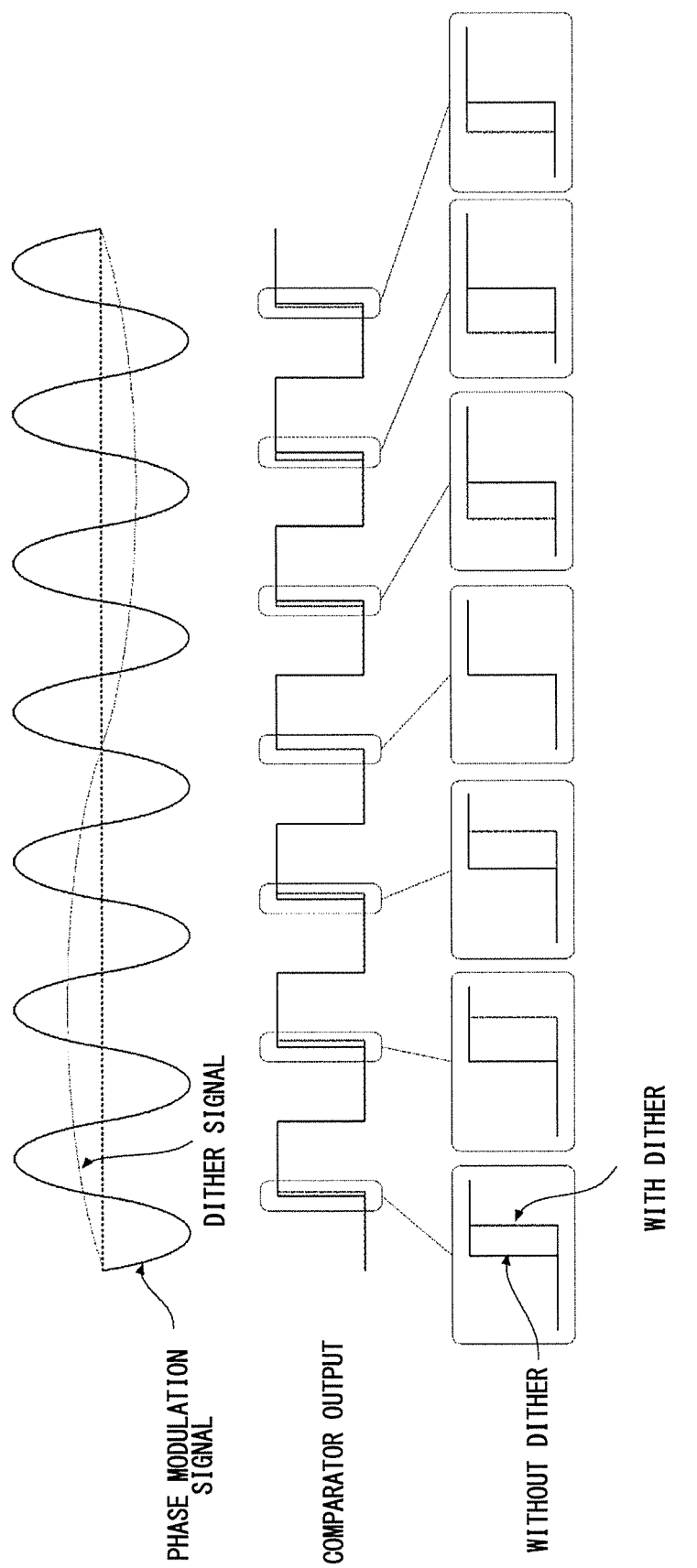
FIG. 9 is a diagram showing another example of the comparison between the phase modulation signal and the dither signal.

While the example in which the sawtooth wave is used as the dither signal is described as shown in FIG. 6 in the aforementioned first embodiment, the dither signal may be a desired wave as long as it is a periodic signal in which the amplitude changes. FIG. 9 is a diagram showing another example of the comparison between the phase modulation signal and the dither signal. In FIG. 9, the vertical axis shows the amplitude and the horizontal axis shows the time. In FIG. 9, the dither signal is a sinusoidal wave and the amplitude value is increased or decreased with time for one cycle. As shown in FIG. 9, since the amplitude value of the dither signal varies for each cycle, the phase shift of the output signal of the comparator varies in accordance with the change in the amplitude value for each cycle. By averaging the count values of the output signal of the comparator for a plurality of cycles, similar to the first embodiment, the resolution is improved by the dither signal.

Second Embodiment

Figure 10:
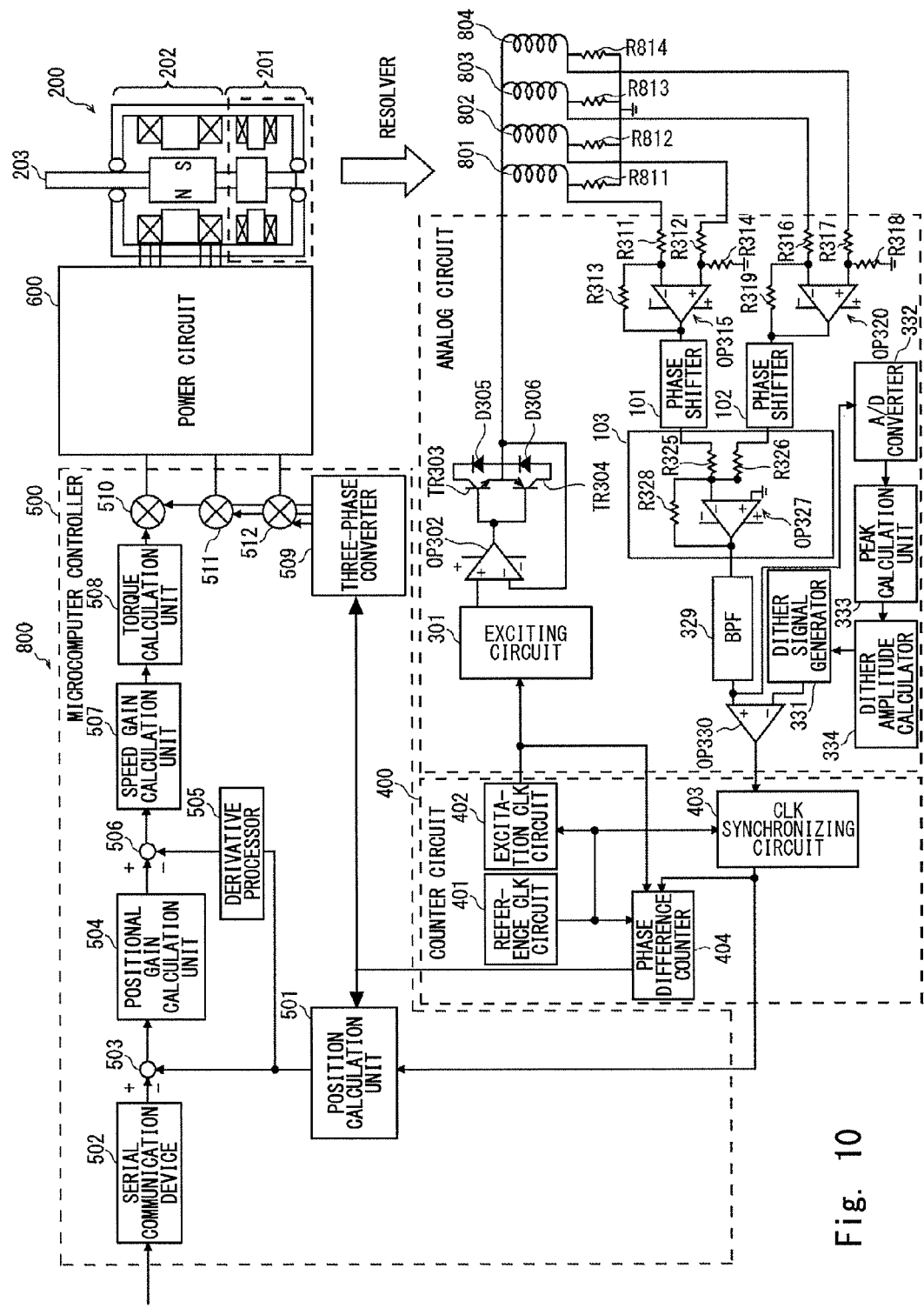
FIG. 10 is a block diagram showing configurations of a signal processor and a control apparatus according to a second embodiment.

In a second embodiment, an example in which a four-phase coil is used as the resolver will be described. FIG. 10 is a block diagram showing configurations of a signal processor and a control apparatus according to the second embodiment.

In FIG. 10, the configurations the same as those in FIG. 2 are denoted by the same reference symbols and overlapping descriptions will be omitted. In FIG. 10, a control apparatus 800 includes coils 801, 802, 803, and 804 and resistors R811, R812, R813, and R814.

The exciting circuit 301 generates a sinusoidal carrier signal at the frequency fc at which the reference clock signal is divided and outputs the carrier signal to the OP amplifier OP302. The OP amplifier OP302, the transistors TR303 and TR304 connected in push-pull connection, and the diodes D305 and D306 amplify the carrier signal and output the carrier signal after the amplification to the coils 801, 802, 803, and 804 of the resolver 201.

The coil 801 has one end connected to the output of the amplification circuit formed of the OP amplifier OP302 and the transistors TR303 and TR304 connected in push-pull connection and the other end connected to an inverting input terminal of the OP amplifier OP315.

Further, the coil 803 has one end connected to the output of the amplification circuit formed of the OP amplifier OP302 and the transistors TR303 and TR304 connected in push-pull connection and the other end connected to a non-inverting input terminal of the OP amplifier OP315.

The OP amplifier OP315 forms a differential amplifier that carries out differential amplification of outputs of the 0-phase coil 801 and the 180-phase coil 803.

In a similar way, the coil 802 has one end connected to the output of the amplification circuit formed of the OP amplifier OP302 and the transistors TR303 and TR304 connected in push-pull connection and the other end connected to an inverting input terminal of the OP amplifier OP320.

Further, the coil 804 has one end connected to the output of the amplification circuit formed of the OP amplifier OP302 and the transistors TR303 and TR304 connected in push-pull connection and the other end connected to a non-inverting input terminal of the OP amplifier OP320.

The OP amplifier OP320 forms a differential amplifier that carries out differential amplification of outputs of the 90-phase coil 802 and the 270-phase coil 804.

As described above, the signal processor and the control apparatus according to the second embodiment are able to accurately detect the rotation angle of the rotor using a four-phase coil for the resolver.

Third Embodiment

When there are winding variations in the resolver, a carrier signal whose phase is fixed remains in the phase modulation signal as a carrier error component, which becomes a major factor in causing a position error. In a third embodiment, an example of removing noise due to this carrier signal will be described.

When the carrier component is not included in X1+X2, which is obtained by synthesizing two-phase signals of the resolver, the speed becomes constant. When the carrier component is included in X1+X2 due to a winding error or the like of the resolver, variation components of an alternating current are superimposed on the speed. This is called a velocity ripple Vr.

Figure 11:
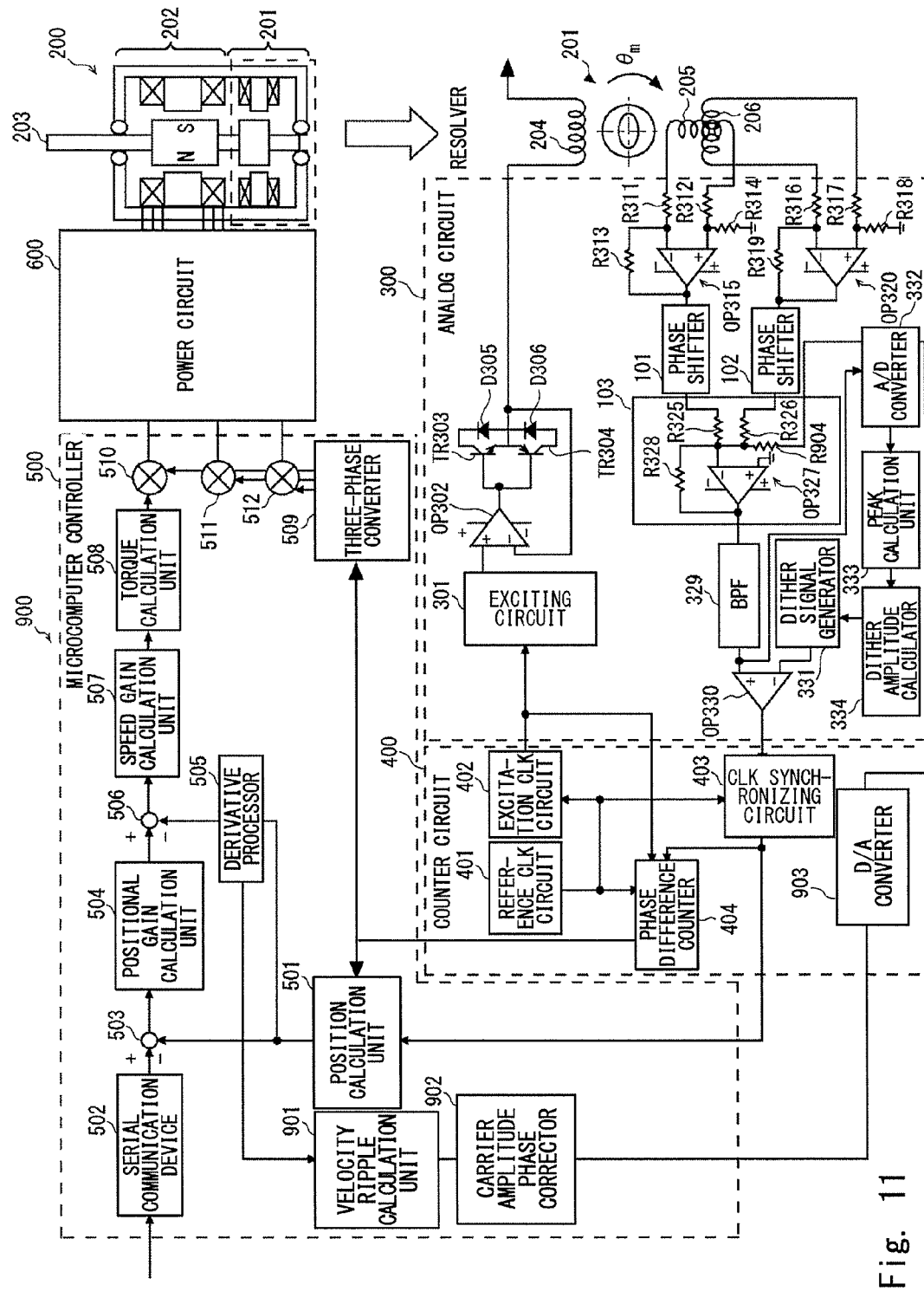
FIG. 11 is a block diagram showing configurations of a signal processor and a control apparatus according to a third embodiment.

FIG. 11 is a block diagram showing configurations of a signal processor and a control apparatus according to the third embodiment. In FIG. 11, the configurations the same as those of FIG. 2 are denoted by the same reference symbols and overlapping descriptions will be omitted. In FIG. 11, a control apparatus 900 includes a velocity ripple calculation unit 901, a carrier amplitude phase corrector 902, a D/A converter 903, and a resistor R904.

The velocity ripple calculation unit 901 calculates a ripple component from a derivative value of the detection signal indicating the rotation position calculated in the derivative processor 505 and outputs the ripple component to the carrier amplitude phase corrector 902.

The carrier amplitude phase corrector 902 generates a correction signal and outputs the correction signal to the D/A converter 903. Further, the carrier amplitude phase corrector 902 arbitrarily changes the phase and the amplitude of the correction signal so that the ripple component becomes a minimum. The operation of changing the phase and the amplitude will be described later.

The D/A converter 903 digital/analog converts the correction signal and outputs the correction signal after the conversion to an inverting input terminal of the OP amplifier OP327 via the resistor R904.

The inverting input terminal of the OP amplifier OP327 receives a signal in which the output of the phase shifter 101, the output of the phase shifter 102, and the output of the D/A converter 903 are superimposed upon one another.

Figure 12:
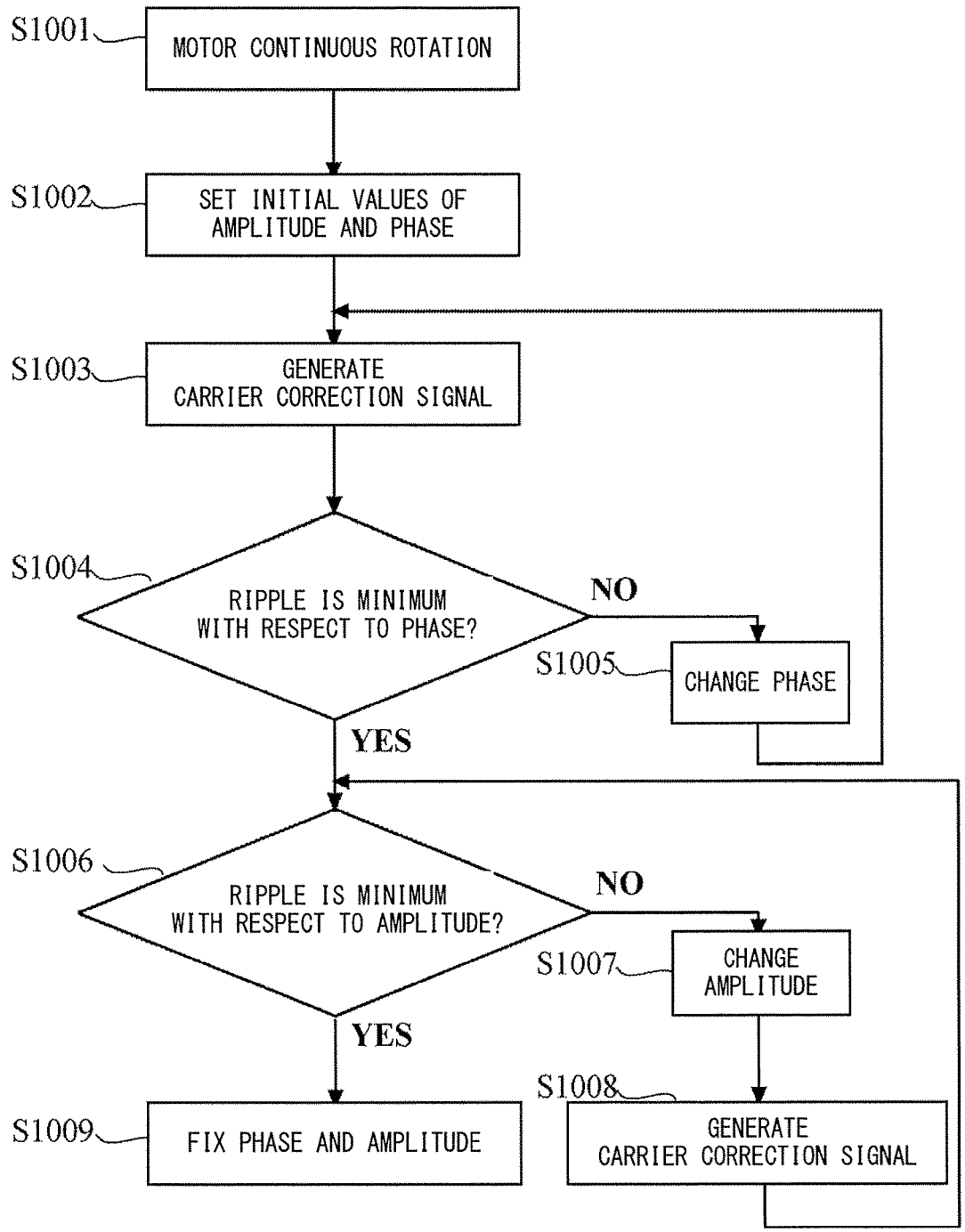
FIG. 12 is a flowchart showing one example of operations of the signal processor and the control apparatus according to the third embodiment.

Next, operations of the signal processor and the control apparatus according to the third embodiment will be described. FIG. 12 is a flowchart showing one example of the operations of the signal processor and the control apparatus according to the third embodiment.

First, in Step S1001, the motor 202 is continuously rotated at a constant rate and then the process goes to Step S1002.

In Step S1002, the carrier amplitude phase corrector 902 sets initial values of the amplitude ε and the phase Δ and then the process goes to Step S1003.

In Step S1003, the carrier amplitude phase corrector 902 generates a carrier correction signal at the amplitude ε and the phase Δ and then the process goes to Step S1004.

In Step S1004, the velocity ripple calculation unit 901 determines whether the velocity ripple Vr is a minimum with respect to the phase Δ. When the velocity ripple Vr is not a minimum with respect to the phase Δ, the process goes to Step S1005 and when the velocity ripple Vr is a minimum with respect to the phase Δ, the process goes to Step S1006.

In Step S1005, the carrier amplitude phase corrector 902 changes the phase Δ and then the process goes back to Step S1003.

In Step S1006, the velocity ripple calculation unit 901 determines whether the velocity ripple Vr is a minimum with respect to the amplitude ε. When the velocity ripple Vr is not a minimum with respect to the amplitude ε, the process goes to Step S1007 and when the velocity ripple Vr is a minimum with respect to the amplitude ε, the process goes to Step S1009.

In Step S1007, the carrier amplitude phase corrector 902 changes the amplitude ε and then the process goes to Step S1008.

In Step S1008, the carrier amplitude phase corrector 902 generates the carrier correction signal at the amplitude ε and the phase Δ and then the process goes back to Step S1006.

In Step S1009, the velocity ripple calculation unit 901 generates the carrier correction signal while fixing the phase Δ and the amplitude ε and processing of setting the amplitude ε and the phase Δ is completed.

This operation is a calibration operation performed when the product is shipped and it is sufficient that this operation be performed only once. Therefore, the values of the phase Δ and the amplitude ε that have been set may be stored in a non-volatile memory in the microcomputer controller 500. Alternatively, this operation may be performed after the product is shipped. This operation may be performed, for example, in an initial operation performed when, for example, a power supply is turned on.

As described above, the signal processor and the control apparatus according to the third embodiment generate the correction signal that cancels the ripple component, which occurs due to the carrier signal of the resolver, search for the phase and the amplitude of the correction signal at which the ripple component becomes a minimum, and superimpose the correction signal on the phase modulation signal, whereby it is possible to remove noise due to the carrier signal.

In each of the aforementioned embodiments, the counter circuit 400 and the microcomputer controller 500 may be executed by a hardware such as an Application Specific Integrated Circuit (ASIC) or software. Further, some of the processings may be executed by software and the other processings may be executed by hardware. When the processings are executed by software, a computer system such as a microprocessor including one or a plurality of central processing units (CPUs) may execute a program regarding processing of the functional blocks.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

While the invention made by the present inventors has been specifically described based on the embodiments, it is needless to say that the present invention is not limited to the embodiments already stated above and various changes may be made on the embodiments without departing from the spirit of the present invention.

For example, the numerical values of the carrier frequency and the phase shift are not limited to those stated in the aforementioned embodiments.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first second and third embodiments can be combined as desirable by one of ordinary skill in the art.

What is claimed is:

1. A signal processor comprising:
   a comparator that compares a signal obtained by phase modulating a carrier frequency at a rotor rotation angle of a resolver with a dither signal; and
   a generator that generates the dither signal based on an amplitude value of the signal obtained by phase modulating the carrier frequency,
   wherein the dither signal is a signal whose amplitude is periodically changed.

2. The signal processor according to claim 1, comprising:
   a peak calculation unit that calculates a maximum amplitude value of the signal obtained by phase modulating the carrier frequency; and
   a dither amplitude calculator that calculates an amplitude value of the dither signal based on the maximum amplitude value of the signal obtained by phase modulating the carrier frequency,
   wherein the generator generates the dither signal having the maximum amplitude value calculated by the dither amplitude calculator.

3. The signal processor according to claim 2, comprising:
   a reference clock circuit that generates a reference signal of a reference frequency; and
   a phase difference counter that counts a phase difference between a result of comparison in the comparator and the reference signal by a resolution of the reference frequency.

4. The signal processor according to claim 3, wherein a frequency of the dither signal is lower than the reference frequency.

5. The signal processor according to claim 1, comprising:
   a first phase shifter that shifts, for a signal having at least two or more phases detected by the resolver excited by a carrier signal at a carrier frequency fc, a phase of a first phase signal of the resolver at a pole of a frequency f1, which is lower than the carrier frequency fc;
   a second phase shifter that shifts a phase of a second phase signal of the resolver at a pole of a frequency f2, which is higher than the carrier frequency fc; and
   a synthesizer that synthesizes the first phase signal whose phase has been shifted and the second phase signal whose phase has been shifted to obtain a phase modulation signal in which the carrier signal has been modulated at the rotation angle of the rotor of the resolver,
   wherein the comparator compares the phase modulation signal obtained as a result of the synthesis by the synthesizer with the dither signal.

6. The signal processor according to claim 5, wherein each of the first phase shifter and the second phase shifter is an all-pass filter including an OP amplifier.

7. The signal processor according to claim 5, wherein f1=fc/n and f2=fc×n (n is an arbitrary positive real number) are satisfied.

8. The signal processor according to claim 5, wherein a difference between a phase shift φ1 by the first phase shifter and a phase shift φ2 by the second phase shifter is about 90°.

9. The signal processor according to claim 5, comprising a band pass filter that attenuates a range of the phase modulation signal other than a predetermined frequency range that is centered around the carrier frequency fc.

10. A control apparatus comprising:
    a first phase shifter that shifts, for a signal having at least two or more phases detected by a resolver excited by a carrier signal at a carrier frequency fc, a phase of a first phase signal of the resolver at a pole of a frequency f1, which is lower than the carrier frequency fc;
    a second phase shifter that shifts a phase of a second phase signal of the resolver at a pole of a frequency f2, which is higher than the carrier frequency fc;
    a synthesizer that synthesizes the first phase signal whose phase has been shifted and the second phase signal whose phase has been shifted to obtain a phase modulation signal in which the carrier signal has been modulated at a rotation angle of a rotor of the resolver;
    a generator that generates a dither signal based on an amplitude value of the phase modulation signal;
    a comparator that compares the phase modulation signal with the dither signal;
    a synchronizing circuit that detects a signal indicating a result of the comparison in the comparator through synchronous detection at the carrier frequency fc; and
    a controller that controls a motor based on the signal that has been detected through synchronous detection,
    wherein the dither signal is a signal whose amplitude is periodically changed.

* * * * *